(12) United States Patent
Jung et al.

(10) Patent No.: US 7,893,730 B2
(45) Date of Patent: Feb. 22, 2011

(54) LEVEL SHIFTER AND DRIVING CIRCUIT INCLUDING THE SAME

(75) Inventors: Sang-Hwa Jung, Sunnyvale, CA (US); Han-Seung Lee, Cupertino, CA (US)

(73) Assignee: Silicon Mitus, Inc., Haengdang-dong, Seongdong-gu, Seoul (KR)

( * ) Notice: Subject to any disclaimer, the term of this patent is extended or adjusted under 35 U.S.C. 154(b) by 132 days.

(21) Appl. No.: 12/181,443

(22) Filed: Jul. 29, 2008

(65) Prior Publication Data
US 2010/0026361 A1 Feb. 4, 2010

(51) Int. Cl.
*H03B 1/00* (2006.01)
(52) U.S. Cl. ...................... 327/108; 327/333
(58) Field of Classification Search ............... 327/108, 327/112, 170, 333, 376, 377; 326/81–83
See application file for complete search history.

(56) References Cited

U.S. PATENT DOCUMENTS

| | | | | |
|---|---|---|---|---|
| 5,469,097 A * | 11/1995 | Ho | ............... | 327/170 |
| 5,514,981 A | 5/1996 | Tam et al. | | |
| 5,543,740 A * | 8/1996 | Wong | ............... | 327/108 |
| 6,323,404 B1 * | 11/2001 | Hayashi | ............... | 84/94.1 |
| 6,353,345 B1 * | 3/2002 | Yushan et al. | ............... | 327/112 |
| 6,611,154 B2 | 8/2003 | Grasso et al. | | |
| 6,903,588 B2 * | 6/2005 | Vorenkamp | ............... | 327/170 |
| 7,436,160 B2 * | 10/2008 | Rusu et al. | ............... | 323/284 |
| 2004/0189353 A1 * | 9/2004 | Hatade et al. | ............... | 327/112 |
| 2009/0045851 A1 * | 2/2009 | Iwabuchi et al. | ............... | 327/108 |
| 2009/0160494 A1 * | 6/2009 | Jan | ............... | 327/108 |

* cited by examiner

*Primary Examiner*—Long Nguyen
(74) *Attorney, Agent, or Firm*—Lexyoume IP Group, PLLC.

(57) ABSTRACT

The present invention related to a driving circuit including a level shifter. The driving circuit according to exemplary embodiment of the present invention includes a first level shifter, a second level shifter, and a gate driver. The first level shifter includes a path along which a pulse-on current flows in response to an on-control signal and a path along which a pulse-off control flows in response to an off-control signal. The second level shifter includes a path along which an on-current flows in response to the on-control signal and a path along which an off-control flows in response to the off-control signal. The gate driver turns on the switch in response to the pulse-on current, maintains the turned-on switch in the turn-on state in response to the on-control current, turns off the switch in response to the pulse-off current, and maintains the turned-off switch in the turn-off state in response to the off-control current.

23 Claims, 6 Drawing Sheets

LEVEL SHIFTER AND DRIVING CIRCUIT INCLUDING THE SAME

BACKGROUND OF THE INVENTION (a) Field of the Invention

The present invention relates to a level shifter and a driving circuit including the same. More particularly, the present invention relates to a driving circuit for controlling a switching operation of a switch and a level shifter configured to the driving circuit.

(b) Description of the Related Art

There is an advantage that the possibility of an error occurring in output information is low when information of a continuous current is input to a level shifter. However, the power consumption of a level shifter increases. If the power consumption of a level shifter is decreased in an attempt to overcome this problem, there is a drawback in that a propagation delay increases. To overcome the prior problems, information for controlling on/off of a switching element of a level shifter is transmitted by using a short pulse signal, and a latch circuit is used in order to maintain the transmitted information for a predetermined time. The power consumption and the propagation delay of the level shifter are then decreased. However, the latch circuit is vulnerable to electrical noise generated by an electronic power source situated around the latch circuit. When an output of the latch circuit is changed by the electrical noise, the status of a switching element controlled by a driving circuit can be changed in unintentional ways. Particularly, accuracy of a switching operation in a gate driving circuit of a converter is very important. The converter includes a high side switch and a low side switch, and supplies electrical power according to switching operations of the high side switch and the low side switch. When the latch circuit is incorrectly operated by the noise, the high side switch and the low side switch can be turned on. Then, the switches can be destroyed by an overcurrent that flows through the high side and the low side switches. The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a level shifter and a driving circuit including the same having advantages of decreasing power consumption and propagation delay, and preventing incorrect operation.

In one aspect of the present invention, a driving circuit for controlling operation of a switch, includes: a first level shifter including a path along which a pulse-on current flows in response to an on-control signal and a path along which a pulse-off current flows in response to an off-control signal; a second level shifter including a path along which an on-control current flows in response to the on-control signal and a path along which an off-current flows in response to the off-control signal; and a gate driver turning on or off the switch. The gate driver turns on the switch in response to the pulse-on current, maintains the turned-on switch in the turn-on state in response to the on-control current, turns off the switch in response to the pulse-off current, and maintains the turned-off switch in the turn-off state in response to the off-control current. The first level shifter includes a first transistor and a second transistor; a first terminal of the first transistor is connected to a first terminal of the second transistor; a node connected to the first transistor and the second transistor is connected to an input terminal of the gate driver; a first voltage is applied to a second terminal of the first transistor and a second voltage is applied to a second terminal of the second transistor. The path along which the pulse-on current flows includes the first transistor, and the path along which the pulse-off current flows includes the second transistor. The driving circuit further includes a first level shifter controller for turning on the first transistor in response to the pulse-on control signal having a pulse signal during a first period according to the on-control signal, and for turning on the second transistor in response to the pulse-off control signal having a pulse signal during a second period according to the off-control signal. The pulse-on control signal in synchronization with a time when the on-control signal changes from a first level to a second level has a pulse signal during the first period, and the pulse-off control signal in synchronization with a time when the off-control signal changes from a third level to a fourth level has a pulse signal during the second period. The driving circuit further includes a pulse generator for sensing the time when the on-control signal changes from the first level to the second level by receiving the on-control signal, for generating the pulse-on control signal, for sensing time when the off-control signal changes from the third level to the fourth level by receiving the off-control signal, and for generating the pulse-off control signal.

In one aspect of the present invention, the first level shifter controller includes: a third transistor including a gate electrode to which the pulse-on control signal is applied to and a first terminal to which a third voltage is applied; a first resistor including a first terminal to which a second terminal of the third transistor is connected and a second terminal to which the second voltage is applied; an inverter including an input terminal which is connected to the second terminal of the third transistor and an output terminal, which is connected to the gate electrode of the first transistor; a fourth transistor including a gate electrode to which the pulse-off control signal is applied and a first terminal to which the third voltage is applied; and a second resistor including a first terminal which is connected to a second terminal of the fourth transistor and a second terminal to which the second voltage is applied, In addition, the second terminal of the fourth transistor and the first terminal of the second resistor are connected to the gate electrode of the second transistor.

In one aspect of the present invention, the first level shifter controller includes: a third transistor including a gate electrode to which the pulse-on control signal is applied and a first terminal to which the third voltage is applied; a fourth transistor including a gate electrode which is connected to the gate electrode of the first transistor, and that is diode-connected; a current mirror circuit for copying the current flowing through the third transistor and for transmitting the copied current to the fourth transistor; a fifth transistor including a gate electrode to which the pulse-off control signal is applied and a first terminal to which the third voltage is applied; and a sixth transistor including a gate electrode which is connected to the gate electrode of the second transistor and a first terminal which is connected to a second terminal of the fifth transistor, and that is diode-connected. The current mirror circuit includes: a seventh transistor including a first terminal which is connected to the fourth transistor and a second terminal to which the second voltage is applied; and an eighth transistor including a gate electrode which is connected to a gate electrode of the seventh transistor, a first terminal which is connected to the second terminal of the third transistor, and a second terminal to which the second voltage is applied, and that is diode-connected.

In one aspect of the present invention, the second level shifter includes a first transistor and a second transistor. A first terminal of the second transistor is connected to a first terminal of the first transistor, a node connected to the first transistor and the second transistor is connected to an input terminal of the gate driver, a first voltage is applied to a second terminal of the first transistor and a second voltage is applied to a second terminal of the second transistor. The path along which the on-current flows includes the first transistor and the path along which the off-current flows includes the second transistor. In one aspect of the present invention, the driving circuit further includes a second level shifter controller for turning on the first transistor in response to the on-control signal and for turning on the second transistor in response to the off-control signal. The second level shifter controller includes: a bias current source; a third transistor including a gate electrode to which the on-control signal is applied and a first terminal which is connected to the bias current source; a fourth transistor including a gate electrode to which the off-control signal is applied and a first terminal which is connected to the bias current source; a fifth transistor including a gate electrode which is connected to the gate electrode of the first transistor, and that is diode-connected; a current mirror circuit that transmits a current flowing through the third transistor to the fifth transistor; and a sixth transistor including a gate electrode which is connected to the gate electrode of the second transistor and a first terminal which is connected to the second terminal of the fourth transistor, and that is diode-connected. The current mirror circuit includes: a seventh transistor including a first terminal which is connected to the fifth transistor and a second terminal to which the second voltage is applied; and an eighth transistor including a gate electrode which is connected to the gate electrode of the seventh transistor, a first terminal which is connected to the second terminal of the third transistor, and a second terminal to which the second voltage is applied, and that is diode-connected. The pulse-on current is larger than the on-current and the pulse-off current is larger than the off-current. A period when the pulse-on current flows is shorter than a period when the current flows and a period when the pulse-off current flows is shorter than a period when the off-current flows. The pulse-on current is maintained during a predetermined period after the on-current is generated and the pulse-off current is maintained during a predetermined period after the off-current is generated.

In another aspect of the present invention, a driving circuit for controlling operation of a first switch and a second switch includes: a first driving circuit for controlling operation of the first switch; and a second driving circuit for controlling operation of the second switch. The first driving circuit includes a first level shifter including a path along which a first pulse-on current flows in response to a first on-control signal and a path along which a first pulse-off current flows in response to a first off-control signal, a second level shifter including a path along which a first on-current flows in response to the first on-control signal and a path along which a first off-current flows in response to the first off-control signal, and a first gate driver for turning the first switch on or off. The first gate driver turns on the first switch in response to the first pulse-on current, maintains the turned-on first switch in the turn-on state in response to the first on-current, turns off the first switch in response to the first pulse-off current, and maintains the turned-off first switch in the turn-off state in response to the first off-current. The first pulse-on current is larger than the first on-current and the first pulse-off current is larger than the first off-current. A period when the first pulse-on current flows is shorter than a period when the first on-current flows and a period when the first pulse-off current flows is shorter than a period when the first off-current flows. The first pulse-on current is maintained during a predetermined period after the first on-current is generated and the first pulse-off current is maintained during a predetermined period after the first off-current is generated.

In another aspect of the present invention, the second driving circuit includes: a third level shifter including a path along which a second pulse-on current flows in response to a second on-control signal and a path along which a second pulse-off current flows in response to a second off-control signal; a fourth level shifter including a path along which a second on-current flows in response to the second on-control signal and a path along which a second off-current flows in response to the second off-control signal; and a second gate driver for turning the second switch on or off. The second gate driver turns on the second switch in response to the second pulse-on current, maintains the turned-on second switch in the turn-on state in response to the second on-current, turns off the second switch in response to the second pulse-off current, and maintains the turned-off second switch in the turn-off state in response to the second off-current. The second pulse-on current is larger than the second on-current and the second pulse-off current is larger than the second off-current. A period when the second pulse-on current flows is shorter than a period when the second on-current flows and a period when the second pulse-off current flows is shorter than a period when the second off-current flows. The second pulse-on current is maintained during a predetermined period after the second on-current is generated and the second pulse-off current is maintained during a predetermined period after the second off-current is generated.

DETAILED DESCRIPTION OF THE EMBODIMENTS

Figure 1:
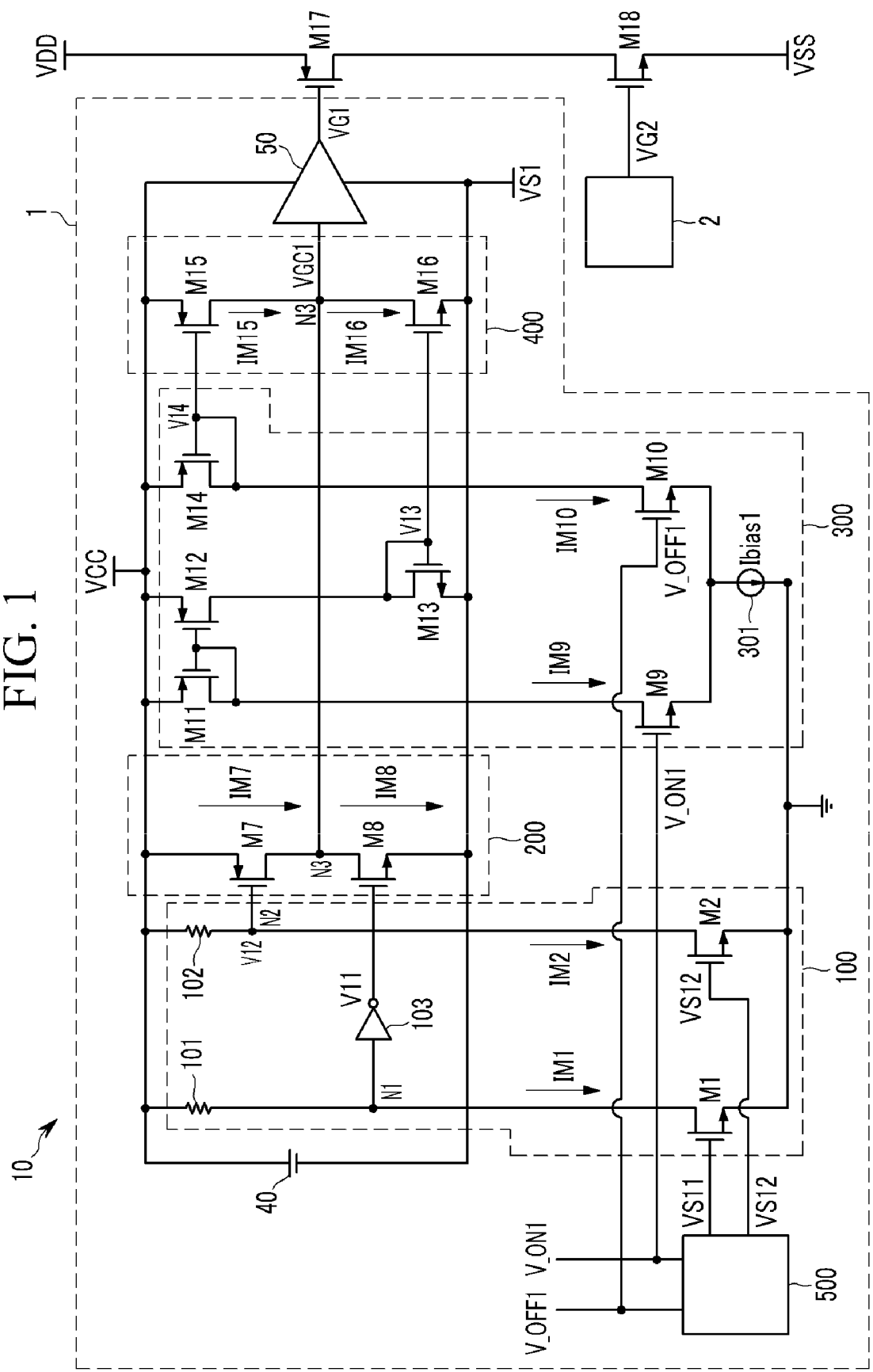
FIG. 1 shows a level shifter and a driving circuit including the same according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements. FIG. 1 shows a level shifter and a driving circuit 10 including the same according to an exemplary embodiment of the present invention The driving circuit 10 includes a high side switch driving circuit 1 and a low side switch driving circuit 2. As shown in FIG. 1, the high side switch driving circuit 1 is connected to a high side switch M17 and the low side switch driving circuit 2 is connected to a low side switch M18. A high side switch gate signal VG1 of the high side switch driving circuit 1 and a low side switch gate signal VG2 of the low side switch driving circuit 2 are respectively are transmitted to each gate electrode of the high side switch M17 and the low side switch M18. A power source voltage VDD is applied to a source electrode of the high side switch M17 and a power source voltage VSS is applied to a source electrode of the low side switch M18. The high side switch M17 and the low side switch M18 are respectively realized as a p-channel metal-oxide semiconductor field-effect transistor (PMOSFET) and an n-channel metal-oxide semiconductor field-effect transistor (NMOSFET). Accordingly, when the high side switch gate signal VG1 level becomes low the high side switch M17 is turned on, and when the level of the low side switch gate signal VG2 becomes high the low side switch M18 is turned on. The high side switch M17 and the low side switch M18 can be alternately turned on/off. First, referring to FIG. 1, a composition of the high side switch driving circuit 1 will be described in detail. The high side switch driving circuit 1 includes a first level shifter controller 100, a first level shifter 200, a second level shifter controller 300, a second level shifter 400, a gate driver 50, and a pulse generator 500. The pulse generator 500 for controlling on/off of the high side switch generates a pulse signal in synchronization with an input control signal. More particularly, the pulse generator 500 generates a pulse-on control signal VS11 having a high level during a predetermined period in synchronization with a rising edge time when an on-control signal V_ON1 changes from a low level to a high level. In addition, the pulse generator 500 generates a pulse-off control signal VS12 having a high level during a predetermined period in synchronization with a rising edge of an off-control signal V_OFF1. The first level shifter controller 100 inputs the pulse-on control signal VS11 and the pulse-off control signal VS12 and generates control signals V11 and V12 to control the first level shifter 200. The first level shifter controller 100 includes resistors 101 and 102, an inverter 103, and transistors M1 and M2. The transistors M1 and M2 are NMOSFET elements. However, the present invention is not limited to the elements, and other switching elements having the same function can be used. The pulse-on control signal VS11 is transmitted to a gate electrode of the transistor M1 and the pulse-off control signal VS12 is transmitted to a gate electrode of the transistor M2. A drain electrode of the transistor M1 is connected to a first terminal of the resistor 101 and an input terminal of the inverter 103. A source electrode of the transistor M1 is grounded. A drain electrode of the transistor M2 is connected to a first terminal of the resistor 102 and a gate electrode of a transistor M7 of the first level shifter 200. A voltage at the drain electrode of the transistor M2 is a voltage level of the control signal V12, and according to the control signal V12, on/off of the transistor M7 is determined. A source electrode of the transistor M2 is grounded. A voltage VCC is applied to second terminals of the resistors 101 and 102. An output terminal of the inverter 103 is connected to a gate electrode of a transistor M8 and an output voltage signal at the inverter 103 is the control signal V11, and according to the control signal V11, on/off of the transistor M8 is determined. The first level shifter 200 determines a voltage of an output signal according to the control signal V11 and the control signal V12, and outputs the output signal to the gate driver 50. The first level shifter 200 includes the transistors M7 and M8, and the transistor M7 and the transistor M8 are respectively the PMOSFET and the NMOSFET. The control signal V12 and the control signal V11 are respectively input to each gate electrode of the transistor M7 and the transistor M8. The voltage VCC is applied to a source electrode of the transistor M7, and a drain electrode of the transistor M7 is connected to the gate driver 50 and a drain electrode of the transistor M8. A voltage VS1 is applied to a source electrode of the transistor M8. A node N3 connected the drain electrode of the transistor M7 and the drain electrode of the transistor M8 is an output terminal of the first level shifter 200. According to an exemplary embodiment of the present invention, the voltage VCC is a high level voltage and the voltage VS1 is a low level voltage. When the transistor M7 is turned on, a voltage difference between the voltage VCC and the voltage VS1 is divided according to a resistance ratio of an on-resistance of the transistor M7 and an off-resistance of the transistor M8. Since the on-resistance of the transistor M7 is much less than the off-resistance of the transistor M8, a voltage at the node N3 is a high level voltage near the voltage VCC. Accordingly, the high level output signal is output from the first level shifter 200. On the other hand, when the transistor M8 is turned on, a voltage difference between the voltage VCC and the voltage VS1 is divided according to a resistance ratio of an off-resistance of the transistor M7 and an on-resistance of the transistor M8. Since the on-resistance of the transistor M8 is much less than the off-resistance of the transistor M7, a voltage at the node N3 is a low level voltage near the voltage VS1. Accordingly, the low level output signal is output from the first level shifter 200. The second level shifter controller 300 includes transistors M9, M10, M11, M12, M13, and M14. The transistor M11 and the transistor M12 form a current mirror circuit, and the transistor M13 forms a current mirror circuit with a transistor M16 of the second level shifter 400. The transistor M14 forms a current mirror circuit with a transistor M15 of the second level shifter 400. The on-control signal V_ON1 is transmitted to a gate electrode of the transistor M9 and the off-control signal V_OFF1 is transmitted to a gate electrode of the transistor M10. A bias current source 301 is connected to source electrodes of the transistors M9 and M10. The second level shifter controller 300 is biased by a current Ibias1 of the bias current source 301. A drain electrode of the transistor M9 is connected to a drain electrode of the diode-connected transistor M11, and a drain electrode of the transistor M10 is connected to a drain electrode of the diode-connected transistor M14. The voltage VCC is applied to source electrodes of the transistors M11, M12, and M14. A gate electrode of the transistor M11 is connected to a gate electrode of the transistor M12. A drain electrode of the transistor M12 is connected to a drain electrode of the diode-connected transistor M13, and a gate electrode of the transistor M13 is connected to a gate electrode of the transistor M16 of the second level shifter 400. A gate electrode of the transistor M14 is connected to a gate electrode of the transistor M15 of the second level shifter 400. While a current IM9 flows through the transistor M9, the transistor M13 is turned on and a control signal V13 is higher than the voltage VS1. The difference between the voltage level of the control signal V13 and the voltage VS1 corresponds to the flowing current IM9. While the current IM9 does not flow through the transistor M9, the transistor M13 is turned off and the control signal V13 is a low level voltage. The difference between the control signal V13 and the voltage VS1 is less than the threshold voltage of the transistor M13. While a current IM10 flows through the transistor M10, the transistor M14 is turned on and a control signal V14 is a lower than the voltage VCC. The difference between the voltage level of the control signal V14 and the voltage VCC corresponds to the flowing current IM10. While the current IM10 does not flow to the transistor M10, the transistor M14 is turned off and the control signal V14 is a high level. The difference between the control signal V14 and the voltage VCC is less than the threshold voltage of the transistor M14. The second level shifter 400 determines, according to the control signals V13 and V14, an output signal level and transmits the output signal to the gate driver 50. The second level shifter 400 includes the transistors M15 and M16. The voltage VCC is applied to a source electrode of the transistor M15, and a drain electrode of the transistor M15 is connected to a drain electrode of the transistor M16 and an input terminal of the gate driver 50. The voltage VS1 is applied to a source electrode of the transistor M16 and a node N3 connected to the drain electrode of the transistor M15, and the drain electrode of the transistor M16 is an output terminal of the second level shifter 400. A voltage at the output terminals of the first and second level shifters 200 and 400, i.e., a voltage of the node N3, is a voltage at a gate driver control signal VGC1. When one of the transistor M9 and the transistor M10 is turned on, the current IM9 and the current IM10 substantially have the same size as the current Ibias1 since the current Ibias1 flows through the turned-on transistor. The voltage levels of the control signal V13 and v14 respectively correspond to the current IM9 and the current IM10. The control signals V13 and v14 are respectively applied to the gate electrode of the transistor M16 and the transistor M15. Accordingly, when the size of the current Ibias1 is controlled, the sizes of the current IM15 and the current IM16 can be controlled. According to an exemplary embodiment of the present invention, the currents IM15 and IM16 flowing to the second level shifter 400 are smaller than the currents IM7 and IM8 flowing to the first level shifter 200. A level of the currents IM15 and M16 will be appropriate when it is satisfied that a voltage level of the gate driver control signal VGC1 is maintained at a constant level after the turn-on and turn-off time of the transistor M17. That is, in order to change the level of the gate driver control signal VGC1 at the turn-on time and the turn-off time of the transistor M17, the first level shifter 200 uses the large currents IM7 and IM8, and thereafter, during an on period and an off period, the level of the gate driver control signal VGC1 is maintained by the small currents IM15 and IM16 of the second level shifter 400. Next, the first level shifter 200 and the second level shifter 400 are equally operated according to an exemplary embodiment of the present invention. The gate driver 50 outputs a gate control signal VG1 having a low level voltage and a high level voltage that can be turned on or turned off to the high side switch M17 according to the gate driver control signal VGC1. The gate driver control signal VGC1 is input to the input terminal of the gate driver 50 and an output terminal of the gate driver 50 is connected to a gate electrode of the high side switch M17, and the voltage VCC and the voltage VS1 are applied to the gate driver 50. The voltage VCC and the voltage VS1 are voltages required to operate the gate driver 50. More particularly, when the gate driver control signal VGC1 level becomes low, near to the voltage VS1, the gate driver 50 outputs the gate control signal VG1 having a low level voltage that is sufficient to turn on the high side switch M17. When the gate driver control signal VGC1 level becomes high, near the voltage VCC, the gate driver 50 outputs the gate control signal VG1 having a high level voltage that is sufficient to turn off the high side switch M17. A voltage source 40 supplies a voltage corresponding to the difference between the voltage VCC and the voltage VS1. FIG. 1 does not show the low side driving circuit 2. The low side driving circuit 2 will be described referring to FIG. 4 to FIG. 6. Next, referring to FIG. 2 an operation of the driving circuit according to an exemplary embodiment of the present invention will be described.

Figure 2:
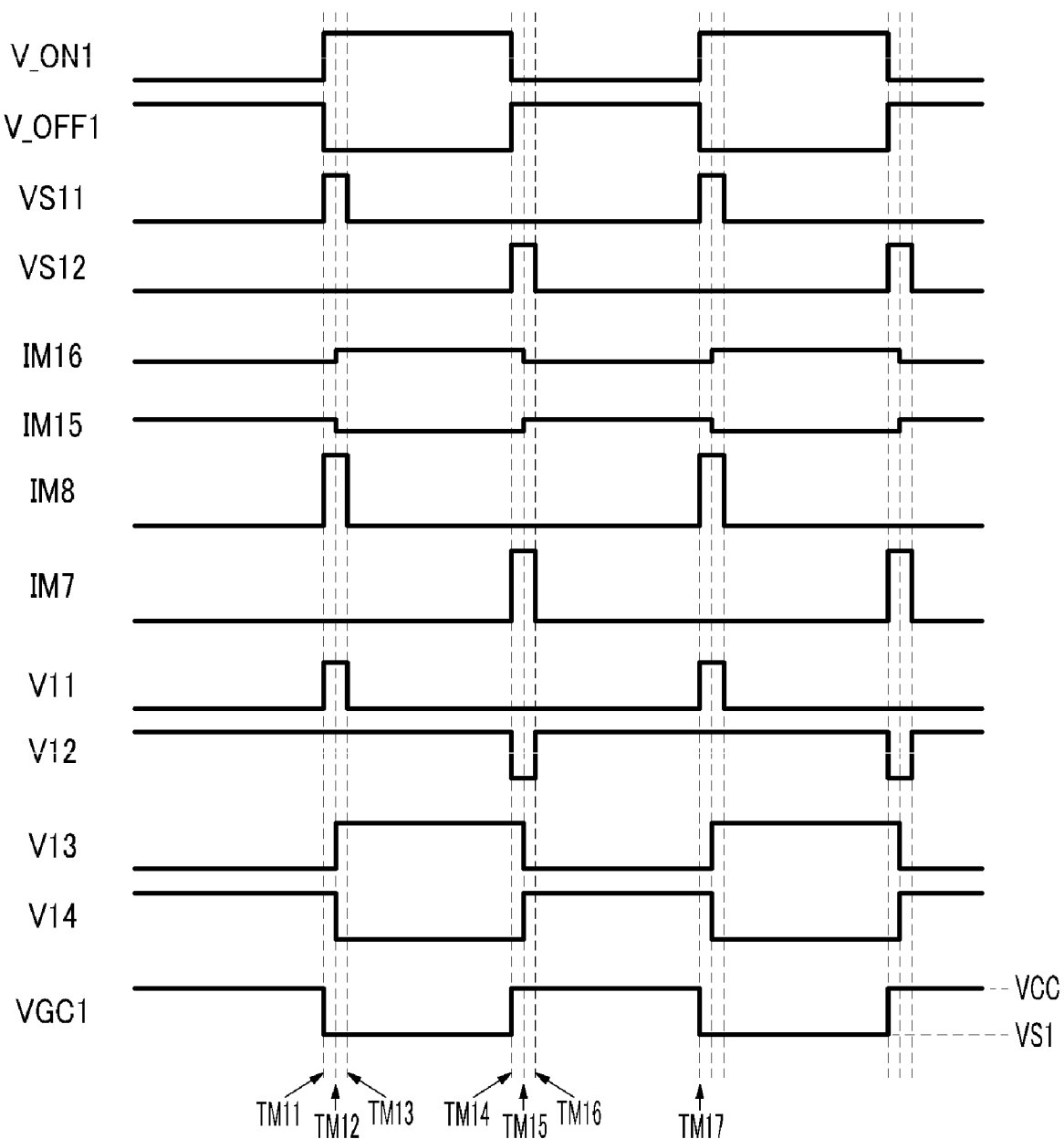
FIG. 2 shows a signal waveform of the driving circuit according to an exemplary embodiment of the present invention.

FIG. 2 shows waveforms of signals of the driving circuit according to an exemplary embodiment of the present invention. First, at time TM11, when the on-control signal V_ON1 changes from a low level to a high level, the pulse-on control signal VS11 in synchronization with a rising edge of the on-control signal V_ON1 is a high level pulse signal during the time interval from TM11 to TM13. At time TM11, when the transistor M1 is turned on by the high level pulse-on control signal VS11, the current IM1 flows through the turned-on transistor M1. Then, a voltage difference between the voltage VCC and the grounded voltage is divided according to the resistance ratio of the resistor 101 and the on-resistance of the transistor M1. A voltage of a node N1 is the divided voltage. When the current IM1 flows through the transistor M1, the voltage at the node N1 is a low level voltage near the ground voltage since the on-resistance of the transistor M1 is much less than the resistor 101. When a low level voltage inputs to the inverter 103, the inverter 103 generates the high level control signal V11 that is sufficient to turn on the transistor M8. The high level control signal V11 is input to the first level shifter 200. Then the high level control signal V11 is transmitted to the gate electrode of the transistor M8. When the transistor M8 is turned on by the high level control signal V11, the quick and large current IM8 flows through the transistor M8. Then the voltage at the node N3 becomes a low level voltage, and the first level shifter 200 outputs the low level gate driver control signal VGC1 to the gate driver 50. The gate driver 50 outputs the low level gate control signal VG1 that is sufficient to turn on the high side switch M17 according to the low level gate driver control signal VGC1. As described above, at time TM11, the gate driver 50 outputs the gate control signal VG1 according to the gate driver control signal VGC1 falling to a low level voltage by the quick and large current IM8. Then, at time TM11, the high side switch M17 is turned on. A time that it takes for the current IM8 to reach a peak value is shorter than a time that it takes for the current IM16 to reach a peak value. The peak value of the current IM8 is larger than that of the current IM16. In addition, at time TM11, when the high level on-control signal V_ON1 is input to the second level shifter controller 300, the transistor M9 is turned on by the high level on-control signal V_ON1 and the current IM9 flows through the transistor M11. A current corresponding to the current IM9 flows through the transistor M12, configuring a current mirror circuit with the transistor M11. In this time, according to an exemplary embodiment of the present invention, the transistor M11 and the transistor M12 are established to have the same characteristic of a ratio of channel width and length, etc., and to have the current flowing through the transistor M12 be the same as the current IM9. When the current flows through the transistor M12, the diode-connected transistor M13 is turned on and then a current flows through the transistor M13. At time TM12, the control signal V13 becomes a high level. It takes the interval from TM11 to TM12 for the control signal V13 to become the high level because of an internal propagation delay. According to the current flowing through the transistor M13, the small current IM16 from time TM12 flows through the transistor M16, configuring the current mirror circuit with the transistor M13. When the current IM16 flows through the transistor M16, a voltage at the node N3 becomes low. Then, the second level shifter 400 outputs the low level gate driver control signal VGC1 to the gate driver 50. Resultantly, the gate driver control signal VGC1 maintains a low level after time TM13. In the driving circuit according to an exemplary embodiment of the present invention, the time TM13 when the quick and large current IM8 does not flow is later than the time TM12 when the small current IM16 begins to flow. Because it takes a predetermined time for the small current IM16 to begin to flow, it needs to maintain the quick and large current IM8 to the time TM13 later than the time TM12. That is, the first level shifter 200 for turning on the high side switch M17 in synchronization with the turn-on time TM11 without a delay generates the low gate driver control signal VGC1 by using the quick and large current IM8. In addition, the second level shifter 400 maintains the gate driver control signal VGC1 in the low level without a latch circuit by using the small current IM16 during the time interval from TM13 to TM14 among the turn-on time interval from TM11 to TM14. Then the driving circuit according to an exemplary embodiment of the present invention can decrease the power consumption and maintain the high side switch M17 in the turn-on state without a complicated latch circuit. At time TM14, the on-control signal V_ON1 changes from a high level to a low level, and the off-control signal V_OFF1 changes from a low level to a high level. Then, the pulse-on control signal VS12 changes from a low level to a high level in synchronization with a rising edge of the off-control signal V_OFF1 and maintains the high level pulse signal during the interval from M14 to TM16. At time TM14, the transistor M2 is turned on by the high level pulse-on control signal VS12 and the current IM2 flows through the turned-on transistor M2. Then, a voltage difference between a voltage VCC and the ground voltage is divided according to a resistance ratio of the resistor 102 and an on-resistance of the transistor M2. A voltage of a node N2 is the divided voltage. When the current IM2 flows through the transistor M2, the voltage of the node N2 is a low level voltage near to the ground voltage since the on-resistance of the transistor M2 is much less than the resistor 102. Accordingly, the control signal V12 changes from a high level voltage to a low level voltage at time TM14, and the first level shifter controller 100 transmits the low level control signal V12 to the first level shifter 200. The low level control signal V12 has a low voltage that is sufficient to turn-on the transistor M7. When the transistor M7 is turned on, the quick and large current IM7 flows through the transistor M7. Then, a voltage at a node N3 is a high level voltage and the first level shifter 200 outputs the high level gate driver control signal VGC1 to the gate driver 50. The gate driver 50 outputs the gate control signal VG1 having a high level voltage that is sufficient to turn off the high side switch M17 according to the high level gate driver control signal VGC1.

Figure 3:
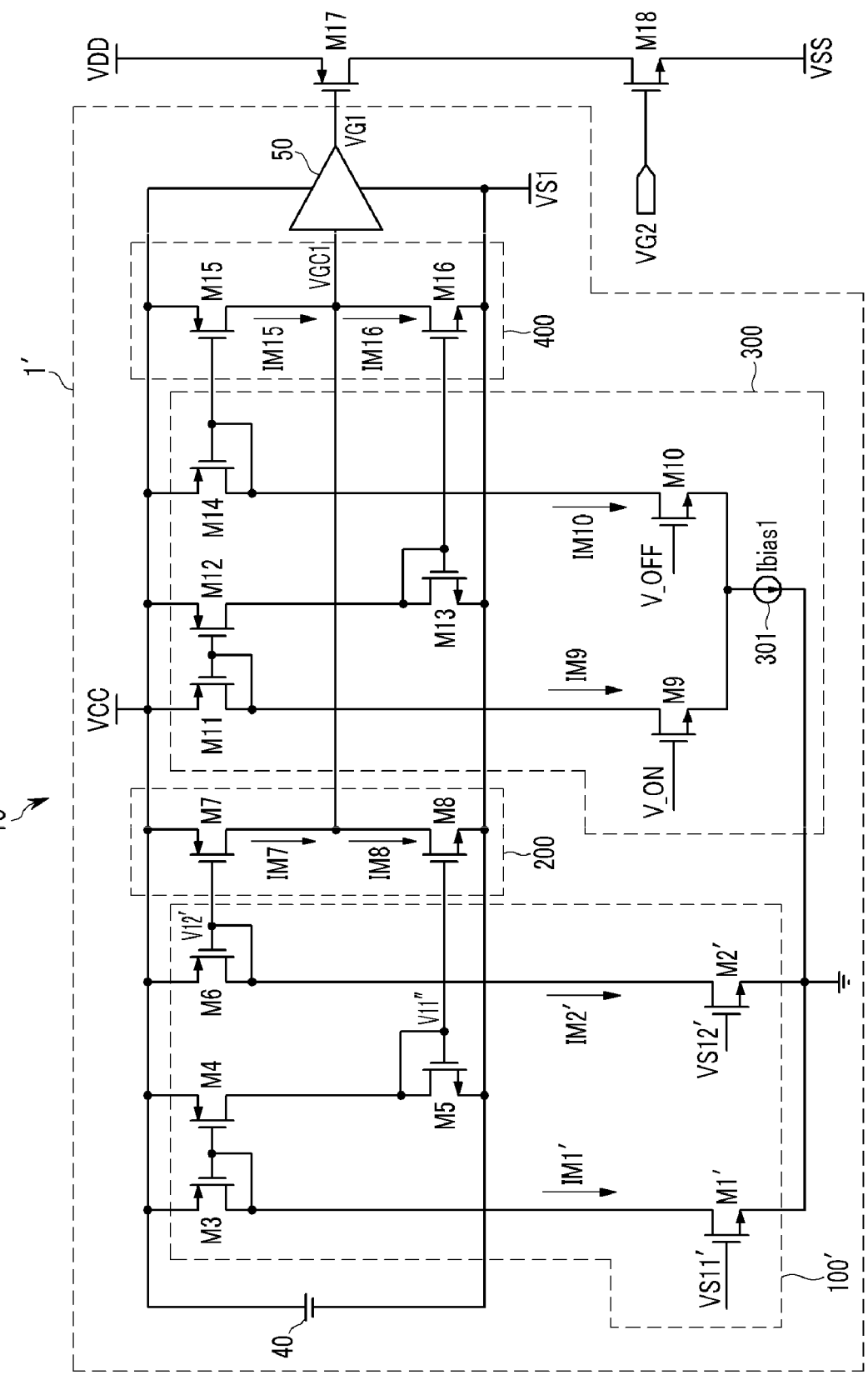
FIG. 3 shows a variation of a driving circuit according to an exemplary embodiment of the present invention.
Figure 4:
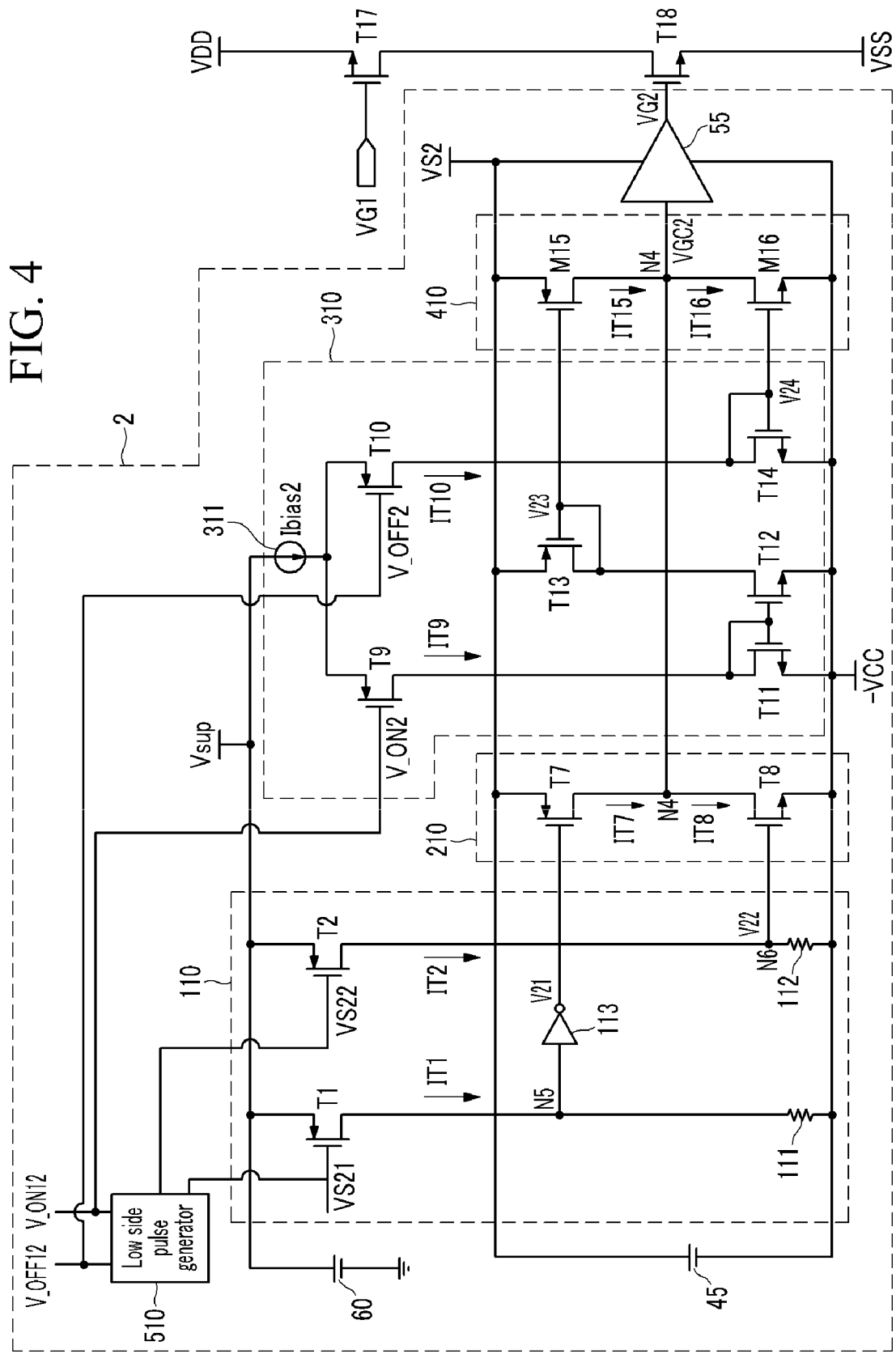
FIG. 4 shows a driving circuit of a low side switch according to an exemplary embodiment of the present invention.
Figure 5:
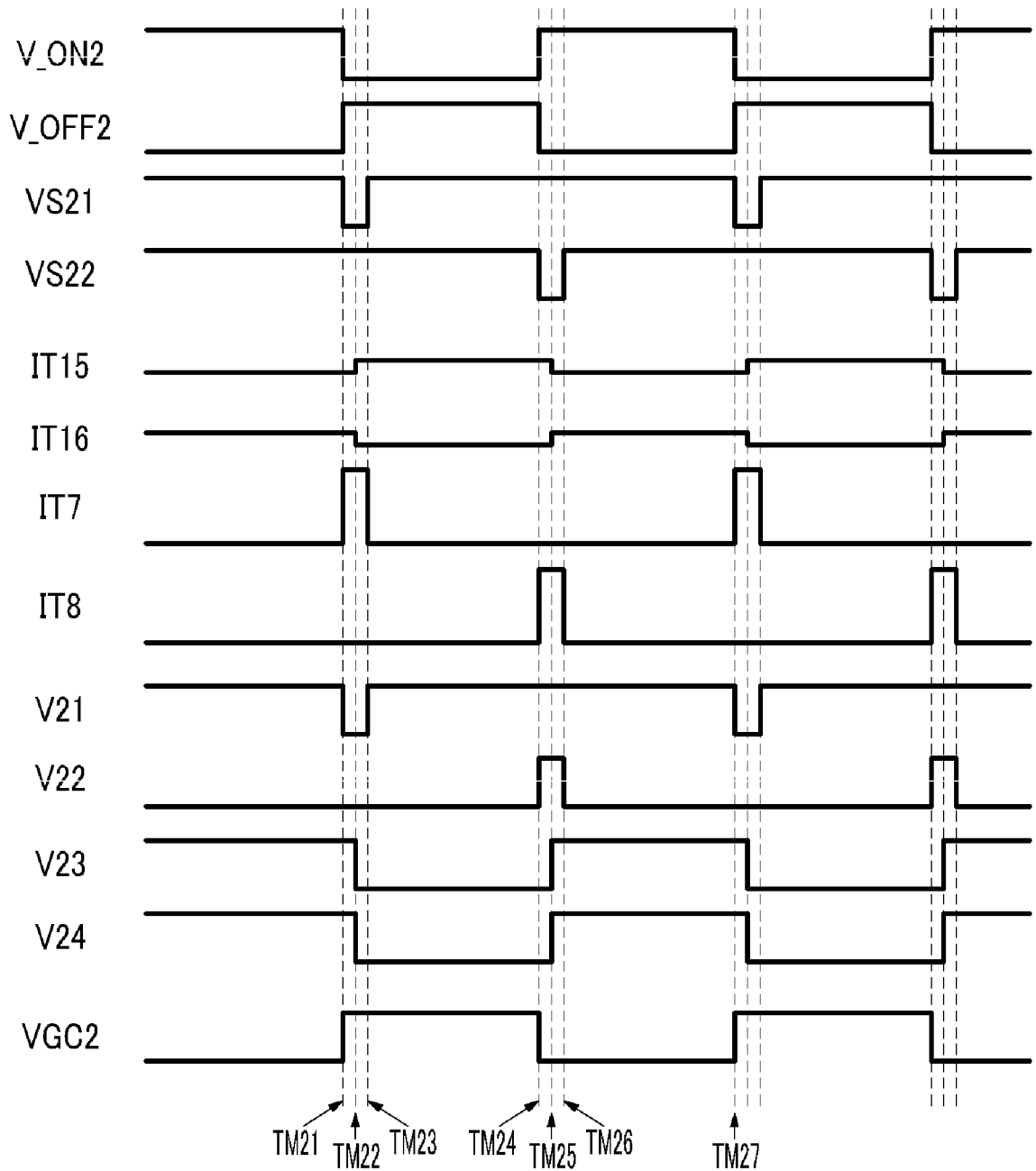
FIG. 5 shows a signal waveform of the driving circuit according to an exemplary embodiment of the present invention.

As described above, at time TM14, the gate driver 50 outputs the gate control signal VG1 turning off the high side switch M17 according to the gate driver control signal VGC1 to be increased by the quick and large current IM7. Then, the high side switch M17 is turned off. A time that it takes for the current IM7 to reach a peak value is shorter than a time that it takes for the current IM15 to reach a peak value. The peak value of the current IM7 is larger that that of the current IM15. In addition, at time TM14, when the high level off-control signal V_OFF1 is input to the second level shifter controller 300, the transistor M10 is turned on by the high level off-control signal V_OFF1 and the current IM10 flows through the transistor M14. At time TM15, the control signal V14 level becomes high. Because of an internal propagation delay, the interval from TM14 to TM15 is needed for the control signal V14 level to become high. From the time TM15, the small current IM15 corresponding to the current IM10 flows through the transistor M15 configuring the current mirror circuit with the transistor M14. When the current IM15 flows through the transistor M15, a voltage at the node N3 is a high level voltage. Then, the second level shifter 400 outputs the high level gate driver control signal VGC1 to the gate driver 50. Resultantly, the gate driver control signal VGC1 maintains a high level after time TM16. The time TM16 when the quick and large current IM7 does not flow is later than the time TM 15 when the small current IM15 begins to flow. Because it takes a predetermined time for the small current IM15 to begin to flow, it needs to maintain the quick and large current IM7 to the time TM16 that is later than the time TM15. That is, the first level shifter 200 makes the gate driver control signal VGC1 to be the high level by using the quick and large current IM7 in synchronization with the turn-off time TM14. The second level shifter 400 maintains the gate driver control signal VGC1 at the high level without a latch circuit by using the small current IM15 during the time interval from TM16 to TM17 among the turn-off time interval from TM14 to TM17. Then the driving circuit according to an exemplary embodiment of the present invention can decrease the power consumption and maintain the turn-off high side switch M17 without a complicated latch circuit. In FIG. 2, during the time interval from TM11 to TM12, the off-control signal V_OFF1 is low. However, a voltage at the node N3 can be a high voltage since the current IM15 flows by an internal propagation delay. To solve the problem, the driving circuit in an exemplary embodiment of the present invention quickly decreases the voltage at the node N3 by using the quick and large current IM8. Then, at time TM 11, the gate driver control signal VGC1 changes from the high level voltage to the low level voltage. During the time interval from TM14 to TM15, the on-control signal V_ON1 is a low level. However, a voltage at the node N3 can be a low level voltage since the current IM16 flows by an internal propagation delay. To solve the problem, the driving circuit in an exemplary embodiment of the present invention quickly increases the voltage at the node N3 by using the quick and large current IM7. Then, at time TM 14, the gate driver control signal VGC1 changes from the low level voltage to the high level voltage without a delay. Next, referring to FIG. 3, a variation according to an exemplary embodiment of the present invention will be described. The driving circuit 10' includes a high side switch driving circuit 1'. FIG. 3 shows a variation of the high side switch driving circuit 1' according to an exemplary embodiment of the present invention. Referring to FIGS. 1 and 3, differences between the high side switch driving circuit 1' shown in FIG. 3 and the high side switch driving circuit 1 shown in FIG. 1 will be mainly described. As shown in FIG. 3, a first level shifter controller 100' further includes transistors M3 to M6. A diode-connected transistor M3 forms a current mirror circuit with a transistor M4, and a diode-connected transistor M5 forms a current mirror circuit with the transistor M8 of the first level shifter 200. A diode-connected transistor M6 forms a current mirror circuit with the transistor M7. A gate voltage of a transistor M5 is a voltage of a control signal V11', and a gate voltage of a transistor M6 is a voltage of a control signal V12'. When a transistor M1' is turned on by a pulse-on control signal VS11', a current IM1' begins to flow through the transistor M3. Then, a current corresponding to the current IM1' flows through the transistor M4 and the transistor M5 is turned on. At this time, the voltage of the control signal V11' is higher than the voltage VS1 according to the current flowing through the transistor M5. The transistor M8 is turned on by the control signal V11' and the quick and large current IM8 begins to flow. In a like manner of the above-described exemplary embodiment of the present invention, other processes of the driving circuit 1' are advanced. When a transistor M2' is turned on by a pulse-off control signal VS12', a current IM2' begins to flow through the transistor M6. In this time, a voltage of the control signal V12' is lower than the voltage VCC according to the current IM2' flowing through the transistor M6. Then, the transistor M7 is turned on by the control signal V12' and the quick and large current IM7 is generated. In a like manner of the above-described exemplary embodiment of the present invention, other processes of the driving circuit 1' are advanced. Next, referring to FIGS. 4 to 6, the low side switch driving circuit 2 according to the exemplary embodiment of the present invention will be described. The low side switch driving circuit 2 is similar to the high side switch driving circuit 1 as described above. The low side switch driving circuit 2 controls the low side switch M18 to be turned on or turned off by using quick and large currents IT7 and IT8, and to maintain an on-state or an off-state by using a small current IT15 and IT16 without a latch circuit. In a like manner of the above-described exemplary embodiment of the present invention, a pulse-on control signal VS21 and a pulse-off control signal VS22 are also generated according to an on-control signal V_ON2 and an off-control signal V_OFF2. FIG. 4 shows the low side switch driving circuit 2 according to an exemplary embodiment of the present invention. The low side switch driving circuit 2 includes a third level shifter controller 110, a third level shifter 210, a fourth level shifter controller 310, a fourth level shifter 410, a low side gate driver 55, and a low side pulse generator 510. The pulse generator 510 for controlling on/off of the low side switch M18 generates a pulse signal in synchronization with an input control signal. More particularly, the pulse generator 510 generates a pulse-on control signal VS21 having a low level during a predetermined period in synchronization with a falling edge of an on-control signal V_ON2. In addition, the pulse generator 510 generates a pulse-off control signal VS22 having a low level pulse during a predetermined period in synchronization with a falling edge of an off-control signal V_OFF2. The third level shifter controller 110 receives the pulse-on control signal VS11 and the pulse-off control signal VS12 and generates control signals V21 and V22 for controlling the third level shifter 210. The third level shifter controller 110 includes resistors 111 and 112 and an inverter 113, and transistors T1 and T2. The transistors T1 and T2 are PMOSFETs. However, the present invention is not limited to the elements, and other switching elements having same function can be used. The pulse-on control signal VS21 is transmitted to a gate electrode of the transistor T1 and the pulse-off control signal VS22 is transmitted to a gate electrode of the transistor T2. A drain electrode of the transistor T1 is connected to a first terminal of the resistor 111 and an input terminal of the inverter 113. A voltage Vsup is supplied to a source electrode of the transistor T1. A drain electrode of the transistor T2 is connected to a first terminal of the resistor 112 and a gate electrode of a transistor M8 of the third level shifter 210. A drain voltage of the transistor T2 is a voltage of the control signal V22, and according to the control signal V22, the transistor M8 is turned on or off. The voltage Vsup is supplied to a source electrode of the transistor T2. A negative voltage −VCC is applied to second terminals of the resistors 111 and 112. An output terminal of the inverter 113 is connected to a gate electrode of a transistor T7 of the third level shifter 210 and an output voltage at the inverter 113 is a voltage of the control signal V21, and according to the control signal V21, the transistor T7 is turned on or off. The third level shifter 210 determines a voltage of an output signal according to the control signal V21 and the control signal V22 and outputs the output signal to the low side gate driver 55. The third level shifter 210 includes the transistors T7 and T8, and the transistor T7 and the transistor T8 are respectively a PMOSFET and a NMOSFET. The control signal V21 and the control signal V22 are respectively input to a gate electrode of the transistor T7 and the transistor T8. A voltage VS2 is applied to a source electrode of the transistor T7, and a drain electrode of the transistor T7 is connected to the low side gate driver 55 and the drain electrode of the transistor T8. The voltage −VCC is applied to a source electrode of the transistor T8. A node N4 of the drain electrode of the transistor T7 and the drain electrode of the transistor T8 is an output terminal of the third level shifter 210. When the transistor T7 is turned on, a voltage difference between the voltage VS2 and the voltage −VCC is divided according to a resistance ratio of an on-resistor of the transistor T7 and an off-resistor of the transistor T8. Since the on-resistor of the transistor T7 is much less than the off-resistor of the transistor T8, the voltage at the node N4 is a high level voltage near the voltage VS2. Accordingly the high level voltage is output from the third level shifter 210. On the other hand, when the transistor T8 is turned on, a voltage difference between the voltage VS2 and the −VCC is divided according to a resistance ratio of an off-resistance of the transistor T7 and an on-resistance of the transistor T8. Since the on-resistance of the transistor T8 is much less than the off-resistance of the transistor T7, the voltage at the node N4 is a low level voltage near to the voltage −VCC. Accordingly, the third level shifter 210 outputs the low level voltage output signal. The voltage VS2 is a high level voltage and the voltage −VCC is a negative voltage according to an exemplary embodiment of the present invention. The fourth level shifter controller 310 includes transistors T9, T10, T11, T12, T13, and T14. The transistor T11 and the transistor T12 form a current mirror circuit. The transistor T13 forms a current mirror circuit with a transistor T15 of the fourth level shifter 410. The transistor T14 forms a current mirror circuit with a transistor T16 of the fourth level shifter 410. The on-control signal V_ON2 is transmitted to a gate electrode of the transistor T9 and the off-control signal V_OFF2 is transmitted to a gate electrode of the transistor T10. Source electrodes of the transistors T9 and T10 are connected to a bias current source 311. The fourth level shifter controller 310 is biased by a current Ibias2 of the current source 311. A drain electrode of the transistor T9 is connected to a drain electrode of the diode-connected transistor T11, and a drain electrode of the transistor T10 is connected to a drain electrode of the diode-connected transistor T14. The voltage −VCC is applied to source electrodes of the transistors T11, T12, and T14. A gate electrode of the transistor T11 is connected a gate electrode of the transistor T12. A drain electrode of the transistor T12 is connected to a drain electrode of the diode-connected transistor T13, and a gate electrode of the transistor T13 is connected to a gate electrode of the transistor T15 of the fourth level shifter 410. A gate electrode of the transistor T14 is connected to a gate electrode of the transistor T16 of the fourth level shifter 410. While a current IT9 flows through the transistor T9, the transistor T13 is turned on and a control signal V23 is lower than the voltage VS2. The difference between the voltage level of the control signal V23 and the voltage VS2 corresponds to the flowing current IT9. While the current IT9 does not flow through the transistor T9, the transistor T13 is turned off and the control signal V23 is a high level voltage. The difference between the control signal V23 and the voltage VS2 is less than the threshold voltage of the transistor T13. While a current IT10 flows through the transistor T10, the transistor T14 is turned on and a control signal V24 is higher than the voltage −VCC. The difference between the voltage level of the control signal V24 and the voltage −VCC corresponds to the flowing current IT10. While the current IT10 does not flow through the transistor T10, the transistor T14 is turned off and the control signal V24 is a high level voltage. The difference between the control signal V24 and the voltage −VCC is less than the threshold voltage of the transistor T14. The fourth level shifter 410 determines, according to the control signals V23 and V24, an output signal level and transmits it to the low side gate driver 55. The fourth level shifter 410 includes the transistors T15 and T16 and the voltage VS2 is applied to a source electrode of the transistor T15, and a drain electrode of the transistor T15 is connected to a drain electrode of the transistor T16 and an input terminal of the low side gate driver 55. The voltage −VCC is applied to a source electrode of the transistor T16, and the drain electrode of the transistor T15 and the drain electrode of the transistor T16 are connected to the node N4 that is an output terminal of the fourth level shifter 410. A voltage of the output terminal of the third and fourth level shifters 210 and 410 is a voltage of a gate driver control signal VGC2. The low side gate driver 55 outputs a gate control signal VG2 having a high level voltage and a low level voltage. The gate control signal VG2 can turn the low side switch M18 on or off. The gate driver control signal VGC2 is inputted to the input terminal of the low side gate driver 55. An output terminal of the low side gate driver 55 is connected to a gate electrode of the low side switch M18. The voltage −VCC and the voltage VS2 are applied to the gate driver 55. The voltage −VCC and the voltage VS2 supply voltages required to operate the low side gate driver 55. More particularly, when the gate driver control signal VGC2 is a high level near the voltage VS2, the low side gate driver 55 outputs the gate control signal VG2 having a high level voltage that is sufficient to turn on the low side switch M18. When the gate driver control signal VGC2 is a low level near the voltage −VCC, the low side gate driver 55 outputs the gate control signal VG2 having a low level voltage that is sufficient to turn off the low side switch M18. A voltage source 45 supplies a voltage corresponding to a difference between the voltage −VCC and the voltage VS2. A voltage source 60 supplies the voltage Vsup. Next, referring to FIG. 5, an operation of the low side switch driving circuit 2 according to an exemplary embodiment of the present invention will be described. FIG. 5 shows waveforms of signals of the low side switch driving circuit 2 according to an exemplary embodiment of the present invention. First, at time TM21, when the on-control signal V_ON2 falls to a low level, the pulse-on control signal VS21 in synchronization with the falling edge of the on-control signal V_ON2 is a low level pulse signal during the time interval from TM21 to TM23. At time TM21, when the transistor T1 is turned on by the low level pulse-on control signal V21, the current IT1 flows through the turned-on transistor T1. Then, a voltage difference between a voltage −VCC and a voltage VS2 is divided according to a resistance ratio of the resistor 111 and on-resistance of the transistor T1. A voltage of a node N5 is the divided voltage. When the current IT1 flows through the transistor T1, the voltage of the node N5 is a high level voltage near the voltage VS2 since the on-resistance is much less than the resistor 111.

Figure 6:
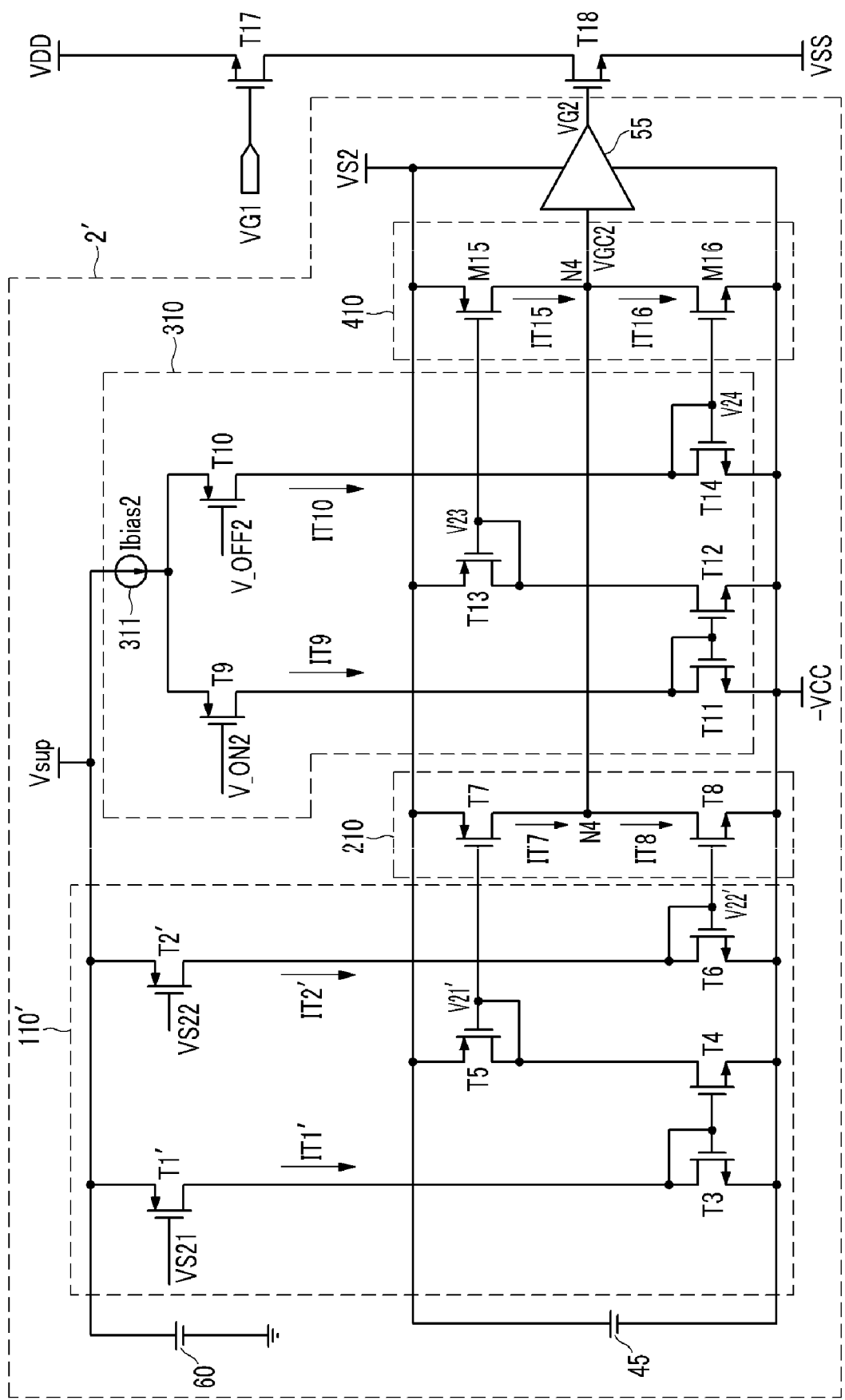
FIG. 6 shows a variation of the driving circuit according to an exemplary embodiment of the present invention.

When the high level voltage is input to the inverter 113, the inverter 113 generates a low level control signal V21 that is sufficient to turn on the transistor T7. The third level shifter controller 110 outputs the low level control signal V21 to the third level shifter 210. Then the low level control signal V21 is transmitted to the gate electrode of the transistor T7. When the transistor M7 is turned on by the low level control signal V21, the quick and large current IT7 begins to flow through the transistor T7. Then, the voltage of the node N4 is a high level voltage and the third level shifter 210 outputs the high level gate driver control signal VGC2 to the low side gate driver 55. The low side gate driver 55 outputs the gate control signal VG2 having a high level voltage that is sufficient to turn on the low side switch M18 according to the high level gate driver control signal VGC2. As described above, at time TM21, the low side gate driver 55 outputs the gate control signal VG2 turning on the low side switch M18 according to the gate driver control signal VGC2 rising to the high level voltage by the quick and large current IT7. Then, at time TM21, the low side switch M18 is turned on by the quick and large current IT7. A time that it takes for the current IT7 to reach a peak value is shorter than a time that it takes for the current IT15 to reach a peak value. The peak value of the current IT7 is larger than that of the current IT15. In addition, at time TM21, when the low level on-control signal V_ON2 is input to the fourth level shifter controller 310, the transistor T9 is turned on by the low level on-control signal V_ON2 and the current IT9 flows through the transistor T11. Then, a current corresponding to the current IT9 flowing through the transistor T12 configuring the current mirror circuit with the transistor 11. In this time, according to an exemplary embodiment of the present invention, the transistor T11 and the transistor T12 are established to have the same characteristic of a ratio of channel width and length, etc., and for the current flowing through the transistor T12 to be the same as the current IT9. When the current flows through the transistor T12, the diode-connected transistor T13 is turned on and a current begins to flow through the transistor T13. At time TM22, the control signal V23 becomes low. It takes the interval from TM21 to TM22 for the control signal V23 to become the low level because of an internal propagation delay. From time TM22, the small current IT15 corresponding to the current flowing through the transistor T13 also flows through the transistor T15, configuring the current mirror circuit with the transistor T13. When the current IT15 flows through the transistor T15, the voltage at the node N4 becomes a high level voltage. Then, the fourth level shifter 410 outputs the high level gate driver control signal VGC2 to the low side gate driver 55. Resultantly, the gate driver control signal VGC2 maintains the high level after the time TM23. In the driving circuit according to an exemplary embodiment of the present invention, the time TM23 when the quick and large current IT7 does not flow is later than the time TM22 when the delayed small current IT15 begins to flow. Because it takes a predetermined time for the small current IT15 to begin to flow, it needs to maintain the quick and large current IT7 to the time TM23 that is later than the time TM22. That is, the third level shifter 210 for turning on the high side switch M17 in synchronization with the turn-on time TM21 without a delay generates the low gate driver control signal VGC2 by using the quick and large current IT7. The fourth level shifter 410 maintains the gate driver control signal VGC2 at the low level without a latch circuit by using the small current IT15 during the interval from TM23 to TM24 among the turn-on time interval from TM21 to TM24. Then the driving circuit according to an exemplary embodiment of the present invention can decrease the power consumption and maintain the low side switch M18 in the turn-on state without a complicated latch circuit. At time TM24, the on-control signal V_ON2 level becomes high and the off-control signal V_OFF2 changes from a high level to a low level. Then, the pulse-on control signal VS22 changes from a low level to a high level in synchronization with a falling edge of the off-control signal V_OFF2 and maintains a low level pulse signal during the time interval from M24 to TM26. At time TM24, the transistor T2 is turned on by the low level pulse-on control signal V22 and the current IT2 flows through the turned-on transistor T2. Then, a voltage difference between a voltage –VCC and a voltage VS2 is divided according to a resistance ratio of the resistor 112 and on-resistance of the transistor T2. A voltage of a node N6 is the divided voltage. When the current flows through the transistor T2, the voltage of the node N6 is a high level near the voltage VS2 since the on-resistance is much less than the resistor 112. Accordingly, the control signal V22 changes from a low level voltage to a high level voltage at time TM24 and the third level shifter controller 110 transmits the high level control signal V22 to the third level shifter 210. The high level control signal V22 is a high voltage that is sufficient to turn on the transistor T8. When the transistor T8 is turned on, the quick and large current IT8 begins to flow through the transistor T8. Then, the voltage at the node N4 is a low level voltage and the third level shifter 210 outputs the low level gate driver control signal VGC2 to the low side gate driver 55. The low side gate driver 55 outputs the gate control signal VG2 having a low level voltage that is sufficient to turn off the low side switch M18 according to the low level gate driver control signal VGC2. As described above, at time TM24, the low side gate driver 55 outputs the gate control signal VG2 turning off the low side switch M18 according to the gate driver control signal VGC2 to be decreased by the quick and large current IT8. Then, the low side switch M18 is turned off. A time that it takes for the current IT8 to reach a peak value is shorter than a time that it takes for the current IT16 to reach a peak value. The peak value of the current IT8 is larger that that of the current IT16. In addition, at time TM24, when the low level off-control signal V_OFF2 is input to the fourth level shifter controller 310, the transistor T10 is turned on by the low level off-control signal V_OFF2 and the current IT10 flows through the transistor T14. At time TM25, the control signal V24 level becomes high. Because of an internal propagation delay, the interval from TM24 to TM25 is needed for the control signal V24 to become high. From time TM25, the small current IT16 corresponding to the current IT10 flows through the transistor T16, configuring the current mirror circuit with the transistor T14. When the current IT16 flows through the transistor T16, the voltage at the node N4 is a low level voltage. Then, the fourth level shifter 410 outputs the low level gate driver control signal VGC2 to the low side gate driver 55. Resultantly, the gate driver control signal VGC2 maintains the high level after time TM26. The time TM26 when the quick and large current IT8 does not flow is later than the time TM25 when the small current IT16 begins to flow. Because it takes a predetermined time for the small current IT16 to begin to flow, it needs to maintain the quick and large current IT8 to the time TM26 that is later than the time TM25. That is, the third level shifter 210 makes the gate driver control signal VGC2 to be the low level by using the quick and large current IT8 in synchronization with the time TM24. The fourth level shifter 410 maintains the gate driver control signal VGC2 at the low level without a latch circuit by using the small current IT16 during the interval from TM26 to TM27 among the turn-off time interval from TM24 to TM27. Then the driving circuit 2 according to an exemplary embodiment of the present invention can decrease the power consumption and maintains the low side switch M18 in the turn-off state without a complicated latch circuit. In FIG. 5, during the time interval from TM21 to TM22, the off-control signal V_OFF2 is high. However, the voltage at the node N4 can be a low level voltage since the current IT16 flows by an internal propagation delay. To solve the problem, the driving circuit in an exemplary embodiment of the present invention quickly increases the voltage at the node N4 by using the quick and large current IT7. Then, at time TM 21, the gate driver control signal VGC2 changes from the low voltage level to the high level voltage without a delay. During the time interval TM24 to TM25, the on-control signal V_ON2 is a high level. However the voltage at the node N4 can be a high level voltage since the current IT15 flows by an internal propagation delay. To solve the problem, the driving circuit in an exemplary embodiment of the present invention quickly decreases the voltage at the node N4 by using the quick and large current IT8. Then, at time TM 24, the gate driver control signal VGC2 changes from the high level voltage to the low level voltage without a delay. Next, referring to FIG. 6, a variation of the low side switch driving circuit 2 according to an exemplary embodiment of the present invention will be described. FIG. 6 shows a variation exemplary of the low side switch driving circuit 2' according to an exemplary embodiment of the present invention. Referring to FIGS. 4 and 6, differences between the driving circuit 2' shown in FIG. 6 and the driving circuit 2 shown in FIG. 4 will be described. As shown in FIG. 6, a third level shifter controller 110' further includes transistors T3 to T6. The diode-connected transistor T3 forms a current mirror circuit with the transistor T4 and the diode-connected transistor T5 forms a current mirror circuit with the transistor T7 of the third level shifter 210. In addition, the diode-connected transistor T6 forms a current mirror circuit with the transistor T8 of the third level shifter 210. A voltage of a gate electrode of the transistor T5 is a voltage of a control signal V21', and a voltage of a gate electrode of the transistor T6 is a voltage of a control signal V22'. When the transistor T1' is turned on by the pulse-on control signal VS21', the current IT1' begins to flow through the transistor T3. Then, a current corresponding to the current IT1' flows through the transistor T4 and the transistor T5 is turned on. In this time, the voltage of the control signal V21' is lower than the voltage VS2 according the current flowing through the transistor T5. The transistor T7 is turned on by the control signal V21' and the quick and large current IT7 begins to flow. In a like manner of the above-described exemplary embodiment of the present invention, other processes of the low side driving circuit 2' are advanced. When the transistor T2' is turned on by the pulse-off control signal VS22', the current IT2' flows through the transistor T6. In this time, the voltage at the control signal V22' is higher than the voltage –VCC according the current flowing through the transistor T6. Then, the transistor T8 is turned on by the control signal V22' and the quick and large current IT8 begins to flow. In a like manner of the above-described exemplary embodiment of the present invention, other processes of the driving circuit 2' are advanced. As described above, the driving circuit according to an exemplary embodiment of the present invention can decrease an error occurrence and power consumption by using a continuous low current. In addition, since the switches use a pulse current at turn-on and turn-off times, a delay of a switching operation of the high side switch and the low side switch can be prevented. Further, the driving circuit according to an exemplary embodiment of the present invention maintains the switch in one of an on-state or an-off state without a latch circuit by using a continuous low current during an on-sustain period and an off-sustain period. Then, the driving circuit can have a simple configuration. According to the exemplary embodiment of the present invention, the on-control signal V_ON1 and the off-control signal V_OFF1 of the high side switch driving circuit 1 and the on-control signal V_ON2 and the off-control signal V_OFF2 of the low side switch driving circuit 2 have been described separately. However, it is to be understood that the invention is not limited to the disclosed embodiments. More particularly, when the high side switch M17 and the low side switch M18 can be alternately turned on/off, the on-control signal V_ON1 and the on-control signal V_ON2 can be the same signal and the off-control signal V_OFF1 and the off-control signal V_OFF2 can be the same signal. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A driving circuit for controlling operation of a switch, comprising:
    a first level shifter including a path along which a pulse-on current flows in response to an on-control signal and a path along which a pulse-off current flows in response to an off-control signal;
    a second level shifter including a path along which an on-control current flows in response to the on-control signal and a path along which an off-control current flows in response to the off-control signal; and
    a gate driver turning on or off the switch, wherein
    the gate driver
    turns on the switch in response to the pulse-on current, maintains the turned-on switch in the turn-on state in response to the on-control current, turns off the switch in response to the pulse-off current, and maintains the turned-off switch in the turn-off state in response to the off-control current.

2. The driving circuit of claim 1, wherein:
    the first level shifter includes a first transistor and a second transistor;
    a first terminal of the first transistor is connected to a first terminal of the second transistor;
    a node connected to the first transistor and the second transistor is connected to an input terminal of the gate driver;
    a first voltage is applied to a second terminal of the first transistor and a second voltage is applied to a second terminal of the second transistor; and
    the path along which the pulse-on current flows includes the first transistor and the path along which the pulse-off current flows includes the second transistor.

3. The driving circuit of claim 2, further comprising
    a first level shifter controller for turning on the first transistor in response to the pulse-on control signal having a pulse signal during a first period according to the on-control signal, and for turning on the second transistor in response to the pulse-off control signal having a pulse signal during a second period according to the off-control signal.

4. The driving circuit of claim 3, wherein
    the pulse-on control signal in synchronization with a time when the on-control signal changes from a first level to a second level has a pulse signal during the first period, and the pulse-off control signal in synchronization with a time when the off-control signal changes from a third level to a fourth level has a pulse signal during the second period.

5. The driving circuit of claim 4, further comprising
    a pulse generator for sensing the time when the on-control signal changes from the first level to the second level by receiving the on-control signal, for generating the pulse-on control signal, for sensing time when the off-control signal changes from the third level to the fourth level by receiving the off-control signal, and for generating the pulse-off control signal.

6. The driving circuit of claim 3, wherein
    the first level shifter controller comprises:
    a third transistor including a gate electrode to which the pulse-on control signal is applied to and a first terminal to which a third voltage is applied;
    a first resistor including a first terminal to which a second terminal of the third transistor is connected and a second terminal to which the second voltage is applied;
    an inverter including an input terminal which is connected to the second terminal of the third transistor and an output terminal, which is connected to the gate electrode of the first transistor;
    a fourth transistor including a gate electrode to which the pulse-off control signal is applied and a first terminal to which the third voltage is applied; and
    a second resistor including a first terminal which is connected to a second terminal of the fourth transistor and a second terminal to which the second voltage is applied,
    wherein the second terminal of the fourth transistor and the first terminal of the second resistor are connected to the gate electrode of the second transistor.

7. The driving circuit of claim 3, wherein
    the second level shifter controller comprises:
    a third transistor including a gate electrode to which the on control signal is applied and a first terminal to which a third voltage is applied;
    a fourth transistor including a gate electrode which is connected to a transistor of the second level shifter through which the on-control current flows, and the fourth transistor is diode-connected;
    a current mirror circuit for copying the current flowing through the third transistor and for transmitting the copied current to the fourth transistor;
    a fifth transistor including a gate electrode to which the off control signal is applied and a first terminal to which the third voltage is applied; and
    a sixth transistor including a gate electrode which is connected to a transistor of the second level shifter through which the off-control current flows and a first terminal which is connected to a second terminal of the fifth transistor, and the sixth transistor is diode-connected.

8. The driving circuit of claim 7, wherein
    the current mirror circuit includes:
    a seventh transistor including a first terminal which is connected to the fourth transistor and a second terminal to which the second voltage is applied; and
    an eighth transistor including a gate electrode which is connected to a gate electrode of the seventh transistor, a first terminal which is connected to the second terminal of the third transistor, and a second terminal to which the second voltage is applied, and the eighth transistor is diode-connected.

9. The driving circuit of claim 1, wherein
    the second level shifter includes a first transistor and a second transistor, wherein:
    a first terminal of the second transistor is connected to a first terminal of the first transistor;
    a node connected to the first transistor and the second transistor is connected to an input terminal of the gate driver;

a first voltage is applied to a second terminal of the first transistor and a second voltage is applied to a second terminal of the second transistor; and the path along which the on-current flows includes the first transistor and the path along which the off-current flows includes the second transistor.

10. The driving circuit of claim 9, further comprising
a second level shifter controller for turning on the first transistor in response to the on-control signal and for turning on the second transistor in response to the off-control signal.

11. The driving circuit of claim 10, wherein
the second level shifter controller comprises:
a bias current source;
a third transistor including a gate electrode to which the on-control signal is applied and a first terminal which is connected to the bias current source;
a fourth transistor including a gate electrode to which the off-control signal is applied and a first terminal which is connected to the bias current source;
a fifth transistor including a gate electrode which is connected to the gate electrode of the first transistor, and that is diode-connected;
a current mirror circuit that transmits a current flowing through the third transistor to the fifth transistor; and
a sixth transistor including a gate electrode which is connected to the gate electrode of the second transistor and a first terminal which is connected to the second terminal of the fourth transistor, and that is diode-connected.

12. The driving circuit of claim 11, wherein
the current mirror circuit comprises:
a seventh transistor including a the first terminal which is connected to the fifth transistor and a second terminal to which the second voltage is applied; and
an eighth transistor including a gate electrode which is connected to the gate electrode of the seventh transistor, a first terminal which is connected to the second terminal of the third transistor, and a second terminal to which the second voltage is applied, and that is diode-connected.

13. The driving circuit of claim 1, wherein
the pulse-on current is larger than the on-current and the pulse-off current is larger than the off-current.

14. The driving circuit of claim 1, wherein:
a period when the pulse-on current flows is shorter than a period when the current flows and a period when the pulse-off current flows is shorter than a period when the off-current flows.

15. The driving circuit of claim 14, wherein:
the pulse-on current is maintained during a predetermined period after the on-current is generated and the pulse-off current is maintained during a predetermined period after the off-current is generated.

16. A driving circuit for controlling operation of a first switch and a second switch, comprising:
a first driving circuit for controlling operation of the first switch; and
a second driving circuit for controlling operation of the second switch,
wherein the first driving circuit includes a first level shifter including a path along which a first pulse-on current flows in response to a first on-control signal and a path along which a first pulse-off current flows in response to a first off-control signal, a second level shifter including a path along which a first on-current flows in response to the first on-control signal and a path along which a first off-current flows in response to the first off-control signal, and a first gate driver for turning the first switch on or off, and
wherein the first gate driver turns on the first switch in response to the first pulse-on current, maintains the turned-on first switch in the turn-on state in response to the first on-current, turns off the first switch in response to the first pulse-off current, and maintains the turned-off first switch in the turn-off state in response to the first off-current.

17. The driving circuit of claim 16, wherein
the first pulse-on current is larger than the first on-current and the first pulse-off current is larger than the first off-current.

18. The driving circuit of claim 16, wherein
a period when the first pulse-on current flows is shorter than a period when the first on-current flows and a period when the first pulse-off current flows is shorter than a period when the first off-current flows.

19. The driving circuit of claim 18, wherein
the first pulse-on current is maintained during a predetermined period after the first on-current is generated and the first pulse-off current is maintained during a predetermined period after the first off-current is generated.

20. The driving circuit of any one of claim 16, wherein
the second driving circuit comprises:
a third level shifter including a path along which a second pulse-on current flows in response to a second on-control signal and a path along which a second pulse-off current flows in response to a second off-control signal;
a fourth level shifter including a path along which a second on-current flows in response to the second on-control signal and a path along which a second off-current flows in response to the second off-control signal; and
a second gate driver for turning the second switch on or off, wherein
the second gate driver
turns on the second switch in response to the second pulse-on current, maintains the turned-on second switch in the turn-on state in response to the second on-current, turns off the second switch in response to the second pulse-off current, and maintains the turned-off second switch in the turn-off state in response to the second off-current.

21. The driving circuit of claim 20, wherein
the second pulse-on current is larger than the second on-current and the second pulse-off current is larger than the second off-current.

22. The driving circuit of claim 20, wherein
a period when the second pulse-on current flows is shorter than a period when the second on-current flows and a period when the second pulse-off current flows is shorter than a period when the second off-current flows.

23. The driving circuit of claim 22, wherein
the second pulse-on current is maintained during a predetermined period after the second on-current is generated and the second pulse-off current is maintained during a predetermined period after the second off-current is generated.

* * * * *